US012796458B2

(12) United States Patent
Kwon et al.

(10) Patent No.: US 12,796,458 B2
(45) Date of Patent: Nov. 10, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Yi Eok Kwon, Suwon-si (KR); Wooyoung Kim, Suwon-si (KR); Jingu Kim, Suwon-si (KR); Sangkyu Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 463 days.

(21) Appl. No.: 18/343,011

(22) Filed: Jun. 28, 2023

(65) Prior Publication Data

US 2024/0213113 A1 Jun. 27, 2024

(30) Foreign Application Priority Data

Dec. 26, 2022 (KR) ........................ 10-2022-0184737

(51) Int. Cl.
*H10W 40/22* (2026.01)
*H10B 80/00* (2026.01)
(Continued)

(52) U.S. Cl.
CPC ............ *H10W 40/22* (2026.01); *H10B 80/00* (2023.02); *H10W 90/00* (2026.01);
(Continued)

(58) Field of Classification Search
CPC ............. H01L 23/3675; H01L 23/3121; H01L 23/3736; H01L 23/3737; H01L 23/49822;
(Continued)

(56) References Cited

U.S. PATENT DOCUMENTS 9,966,325 B2 5/2018 Beyne
9,991,245 B2 6/2018 Kim et al.
(Continued)

FOREIGN PATENT DOCUMENTS

CN 111312697 A 6/2020
CN 115066746 A 9/2022
(Continued)

*Primary Examiner* — Timor Karimy
(74) *Attorney, Agent, or Firm* — Wolf, Greenfield & Sacks, P.C.

(57) ABSTRACT

A semiconductor package includes: a first redistribution layer; at least one lower die on the first redistribution layer; a first through-via on the first redistribution layer; a first molding material that molds the first redistribution layer, the at least one lower die, and the first through-via; a second redistribution layer on the at least one lower die, the first through-via, and the first molding material; at least one upper die on the second redistribution layer and having a thickness between 1.2 and 1.7 times, including endpoints, greater than a thickness of the at least one lower die; a second through-via on the second redistribution layer; a second molding material that molds the second redistribution layer, the at least one upper die, and the second through-via; and a heat dissipation member on the at least one upper die and the second through-via, wherein the heat dissipation member contacts the second through-via.

14 Claims, 15 Drawing Sheets

(51) Int. Cl.

| | |
|---|---|
| ***H10W 40/25*** | (2026.01) |
| ***H10W 70/685*** | (2026.01) |
| ***H10W 74/10*** | (2026.01) |
| ***H10W 90/00*** | (2026.01) |

(52) U.S. Cl.
CPC ........ *H10W 40/251* (2026.01); *H10W 40/258* (2026.01); *H10W 70/685* (2026.01); *H10W 74/114* (2026.01); *H10W 90/401* (2026.01); *H10W 90/724* (2026.01)

(58) Field of Classification Search
CPC ... H01L 23/49833; H01L 25/15; H01L 24/16; H01L 2224/16227; H01L 25/50; H10B 80/00; H10W 40/22; H10W 40/251; H10W 40/258; H10W 90/00; H10W 90/401; H10W 70/685; H10W 74/114; H10W 90/724
See application file for complete search history.

(56) References Cited

U.S. PATENT DOCUMENTS

| | | | | |
|---|---|---|---|---|
| 2008/0246126 | A1* | 10/2008 | Bowles | H01L 25/50 257/659 |
| 2015/0104906 | A1* | 4/2015 | Railkar | H01L 23/3735 438/113 |
| 2016/0204080 | A1 | 7/2016 | Kim et al. | |
| 2016/0276308 | A1* | 9/2016 | Min | H01L 23/36 |
| 2019/0131273 | A1* | 5/2019 | Chen | H01L 24/92 |
| 2020/0373216 | A1* | 11/2020 | Yoo | H01L 24/05 |

FOREIGN PATENT DOCUMENTS

| | | | |
|---|---|---|---|
| KR | 20010047674 | A | 6/2001 |
| KR | 101830938 | B1 | 4/2018 |
| KR | 102265243 | B1 | 6/2021 |

* cited by examiner

SEMICONDUCTOR PACKAGE AND METHOD OF MANUFACTURING THE SAME

CROSS-REFERENCE TO RELATED APPLICATION

This application claims priority to and the benefit of Korean Patent Application No. 10-2022-0184737 filed in the Korean Intellectual Property Office on Dec. 26, 2022, the entire contents of which are incorporated herein by reference.

FIELD

The present disclosure relates to a semiconductor package, such as a fan-out package, and a manufacturing method thereof.

BACKGROUND

Semiconductor packages are developing in various directions to reduce a size/weight of the semiconductor package and/or manufacturing cost of the semiconductor package. A ball grid array (BGA) package may be formed by a method that includes mounting a semiconductor chip on a flexible printed circuit (FPC), performing a molding process, and then attaching solder balls to a lower portion of the FPC. The BGA package may require a molding process, and it is difficult to make the thickness of the semiconductor package thin due to the FPC.

To solve the problem associated with the BGA package, a wafer level package (WLP) has been proposed. The WLP is formed by forming a re-wire pattern under the semiconductor chip without a separate molding process and attaching the solder balls to the re-wire pattern. However, the wafer level package is small in size, so it is not easy to attach the solder balls to satisfy an industry standard. Furthermore, handling and testing of the WLP are difficult.

SUMMARY

The technical object to be addressed by the present disclosure is to provide a semiconductor package with easy heat discharge.

Another technical object that the present disclosure seeks to address is to provide a method for manufacturing a semiconductor package having the above-mentioned advantage.

A semiconductor package according to an embodiment of the present disclosure may include: a first redistribution layer; at least one lower die on the first redistribution layer; a first through-via on the first redistribution layer; a first molding material that molds the first redistribution layer, the at least one lower die, and the first through-via; a second redistribution layer on the at least one lower die, the first through-via, and the first molding material; at least one upper die on the second redistribution layer and having a thickness between 1.2 and 1.7 times, including endpoints, greater than a thickness of the at least one lower die; a second through-via on the second redistribution layer; a second molding material that molds the second redistribution layer, the at least one upper die, and the second through-via; and a heat dissipation member on the upper die and the second through-via, wherein the heat dissipation member contacts the second through-via. In an embodiment, the heat dissipation member one of a metallic member and a resin material, wherein the metallic member includes at least one of copper (Cu), gold (Au), aluminum (Al), tungsten (W), nickel (Ni), tin (Sn), titanium (Ti), and alloys thereof, and wherein the resin material includes at least one of benzocyclobutene (BCB), and polyimide.

In an embodiment, a thickness of the heat dissipation member may be between 15 and 25%, including endpoints, of the thickness of the at least one upper die. In an embodiment, a distance between the heat dissipation member and the at least one upper die may be less than 10% of the thickness of the at least one upper die.

In an embodiment, the heat dissipation member contacts a surface of the at least one upper die. In an embodiment, the a surface of the at least one lower die contacts a second wiring. In an embodiment, wherein the at least one lower die includes a plurality of lower dies, and wherein the semiconductor package further includes a third through-via between the plurality of lower dies. In an embodiment, the at least one upper die includes a plurality of upper dies, and wherein the semiconductor package further includes a third through-via between the plurality of upper dies.

A semiconductor package according to another embodiment of the present disclosure may include: a first redistribution layer; a plurality of lower dies on the first redistribution layer; a first through-via on the first redistribution layer and disposed to a side of the plurality of lower dies; a first molding material that molds the first redistribution layer, the plurality of lower dies, and the first through-via; a second redistribution layer on the lower die, the first through-via, and the first molding material, wherein the second redistribution layer contacts a surface of the plurality of lower dies, an upper portion of the first through-via, and an upper portion of the first molding material; a plurality of upper dies on the second redistribution layer; a second through-via on the second redistribution layer and a side of the plurality of upper dies; a second molding material that molds the second redistribution layer, the plurality of upper dies, and the second through-via; a heat dissipation member on the plurality of upper dies and the second through-via, wherein the heat dissipation member contacts the plurality of upper dies and the second through-via; and a third through-via between the plurality of lower dies or between the plurality of upper dies.

In an embodiment, a plurality of the third through-vias may be between the plurality of lower dies and between the plurality of upper dies. In an embodiment, a thickness of the plurality of upper dies may be between 1.2 and 1.7 times, including endpoints, greater than a thickness of the plurality of lower dies.

In an embodiment, the plurality of lower dies may be between the first through-vias, and the plurality of upper dies may be between the second through-vias. In an embodiment, a thickness of the heat dissipation member may be between 15 and 25%, including endpoints, of a thickness of the plurality of upper dies. In an embodiment, a thickness of the heat dissipation member may be between 150 and 300 μm, including endpoints.

A semiconductor package according to another embodiment of the present disclosure may include: a first redistribution layer; at least one lower die on the first redistribution layer; a first through-via on the first redistribution layer; a first molding material that molds the first redistribution layer, the at least one lower die, and the first through-via; a second redistribution layer on the at least one lower die, the first through-via, and the first molding material; at least one upper die on the second redistribution layer and having a thickness between 1.2 and 1.7 times, including endpoints, greater than a thickness of the at least one lower die; a second through-via on the second redistribution layer; a second molding material that molds the second redistribution layer, the at least one upper die, and the second through-via; and a heat dissipation member on the upper die and the second through-via, wherein the heat dissipation member contacts the second through-via, wherein a thickness of the heat dissipation member is between 15 and 25%, including endpoints, of the thickness of the at least one upper die, and a distance between the heat dissipation member and the at least one upper die is less than 10% of the thickness of the at least one upper die. In an embodiment, the heat dissipation member includes at least one of copper (Cu), gold (Au), aluminum (Al), tungsten (W), nickel (Ni), tin (Sn), titanium (Ti), and alloys thereof. In an embodiment, the heat dissipation member includes at least one of benzocyclobutene (BCB), and polyimide. In an embodiment, the heat dissipation member contacts a surface of the at least one upper die. In an embodiment, a surface of the at least one lower die contacts a second wiring layer. In an embodiment, the thickness of the heat dissipation member is between 150 and 300 μm, including endpoints.

A manufacturing method of a semiconductor package according to another embodiment of the present disclosure includes: forming a redistribution structure on a carrier to form a first redistribution layer; forming at least one first through-via on the first redistribution layer; providing at least one lower die on the first redistribution layer; molding the first redistribution layer, the first through-via, and the lower die with a first molding material; forming a second redistribution layer on the first through-via upper portion, the lower die rear surface, and first molding material upper portion; forming a second through-via on the second redistribution layer; providing at least one upper die having a thickness of 1.2 to 1.7 times the thickness of the lower die on the second redistribution layer; molding the second redistribution layer and the upper die with a second molding material; and forming a heat dissipation member on the upper die, the second through-via, and the second molding material.

In an embodiment, the forming of at least one first through-via on the first redistribution layer may further include forming a third through-via between the lower dies when the lower die is in plural. In an embodiment, the molding of the first redistribution layer, the first through-via, and the lower die may further include grinding so that the lower die rear surface is exposed.

In an embodiment, grinding the upper die rear surface to be exposed before forming the heat dissipation member on the upper die, the second through-via, and the second molding material may be further included. In an embodiment, the forming of the heat dissipation member on the upper die, the second through-via, and the second molding material may include forming the heat dissipation member by plating deposition.

In an embodiment, the forming of the heat dissipation member on the upper die, the second through-via, and the second molding material may include assembling and forming the heat dissipation member including an assemble member that is smaller than the width of the second through-via. In an embodiment, the heat dissipation member may be at least one among copper (Cu), gold (Au), aluminum (Al), tungsten (W), nickel (Ni), tin (Sn), titanium (Ti), and alloys thereof, or at least one of benzocyclobutene (BCB), polyimide, and resin materials thereof.

According to an embodiment of the present disclosure, the semiconductor package forms a thermal path by disposing the via on the rear surface of the lower die and disposing the heat dissipation member on the rear surface of the upper die, thereby easily discharging the heat generated from the lower die and the upper die, and then providing the semiconductor package with excellent heat generation characteristics.

According to another embodiment of the present disclosure, the semiconductor package further includes the through-via between a plurality of lower dies or a plurality of upper dies, thereby easily discharging heat generated from the upper die and the lower die and providing the semiconductor package with excellent strength.

According to another embodiment of the present disclosure, the manufacturing method of the semiconductor package provides the method of manufacturing the semiconductor package having the above-mentioned advantages.

The various and beneficial merits and effects of the present disclosure are not limited to the above, and may be more easily understood in the process of describing specific embodiments of the present disclosure.

DETAILED DESCRIPTION

Figure 1A:
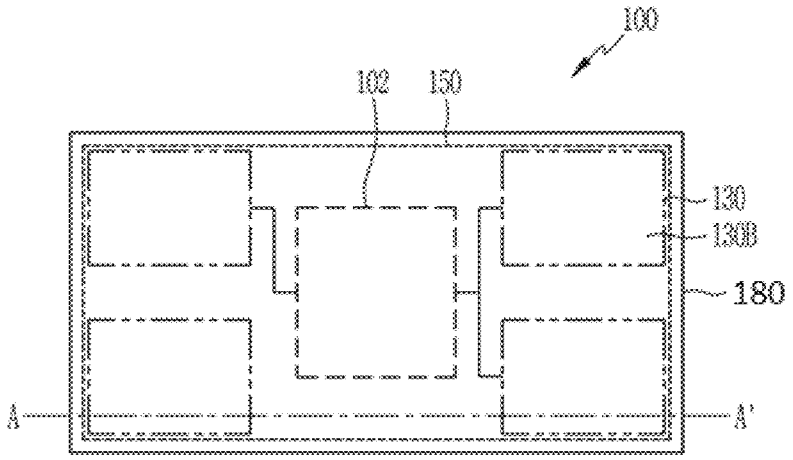
FIG. 1A is a top plan view of a semiconductor package according to an embodiment of present disclosure.

Hereinafter, embodiments of the present disclosure will be described in detail with reference to the accompanying drawings so that those with ordinary skill in the art to which the present disclosure pertains may easily carry out the embodiments. The present disclosure may be implemented in various ways and is not limited to the embodiments described herein.

To clarify the present disclosure, parts that are not connected with the description will be omitted, and the same elements or equivalents are referred to by the same reference numerals throughout the specification.

Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower,"

"above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

As used herein, the phrase "at least one of A, B, and C" refers to a logical (A OR B OR C) using a non-exclusive logical OR, and should not be construed to mean "at least one of A, at least one of B and at least one of C."

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items."

Hereinafter, an embodiment of the present disclosure will be described in detail so that a person of ordinary skill in the technical field to which the present disclosure belongs can easily implement it. As those skilled in the art would realize, the described embodiments may be modified in various ways, all without departing from the spirit or scope of the present disclosure.

Figure 1B:
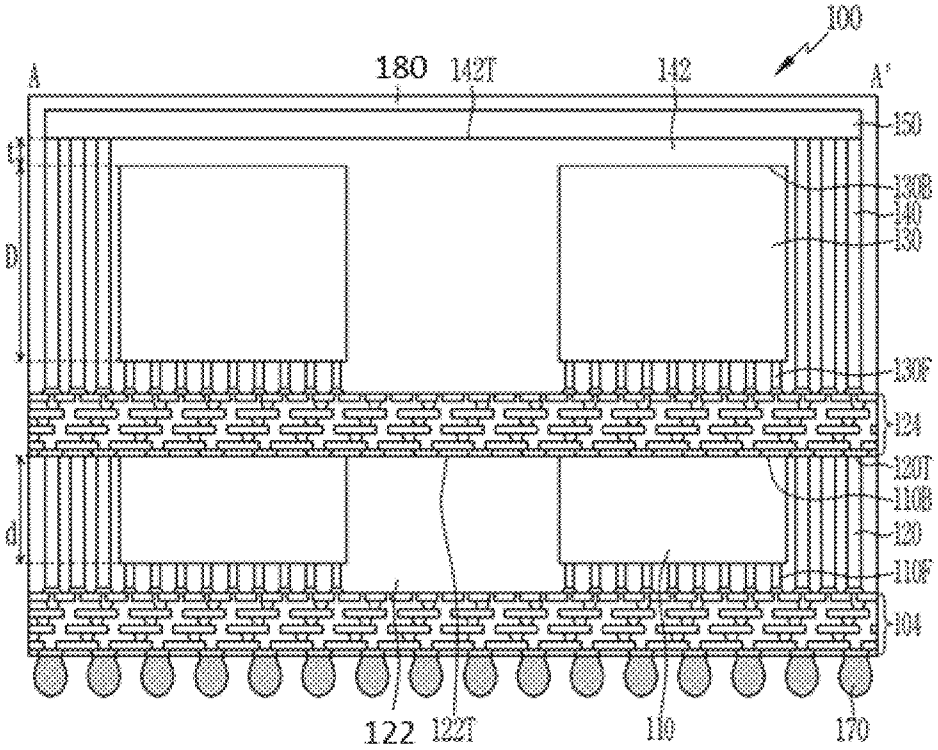
FIG. 1B is a cross-sectional view taken along a line A-A' of FIG. 1A according to an embodiment of the present disclosure.

FIG. 1A is a top plan view of a semiconductor package 100 according to an embodiment of present disclosure, and FIG. 1B is a cross-sectional view taken along a line A-A' of FIG. 1A.

Referring to FIG. 1A, the semiconductor package 100 includes a logic semiconductor (102) and at least one upper die 130. As a non-limiting example, the logic semiconductor 102 may be an application processor (AP), such as a central processing unit (CPU), a graphics processing unit (GPU), a field-programmable gate array (FPGA), a digital signal processor, a cryptographic processor, a microprocessor, a microcontroller, or an application specific integrated circuit (ASIC).

As a non-limiting example, the upper die 130 may be a volatile memory, such as a dynamic random access memory (DRAM) or a static random access memory (SRAM), or a non-volatile memory, such as a flash memory, a phase-change random access memory (PRAM), a magneto resistive random access memory (MRAM), a ferroelectric random access memory (FeRAM), or a resistive random access memory (RRAM). The example of the upper die 130 may also be applicable to the lower die 110, as described below in further detail.

The semiconductor package 100 may include 102*a* heat dissipation member 150 disposed on the rear of the at least one upper die 130. The heat dissipation member 150 may facilitate the discharge of heat generated from the logic semiconductor 102 and the upper die 130.

In an embodiment, the heat dissipation member 150 may have a plate shape. Specifically, the heat dissipation member 150 may simultaneously cover the logic semiconductor 102 and the lower surface of the at least one upper die 130. In another embodiment, the heat dissipation member 150 may have a rod shape. Specifically, the heat dissipation member 150 may have a plurality of rod shapes disposed in a column to cover the logic semiconductor 102 and the rear surface 130B of the at least one upper die 130.

Referring to FIG. 1B, the semiconductor package 100 includes a first redistribution layer 104, at least one lower die 110, a first through-via 120, a first molding material 122, a second redistribution layer 124, the at least one upper die 130, a second through-via 140, a second molding material 142, and the heat dissipation member 150.

The first redistribution layer 104 may include a redistribution insulation layer and a redistribution structure disposed in the redistribution insulation layer, and the redistribution structure may include a redistribution via of mutually connecting redistribution patterns of a multi-layer structure. The arrangement, the number of layers, and the number of redistribution structures disclosed in FIG. 1B are non-limiting examples, and are not limited thereto.

The at least one lower die 110 may be disposed on the first redistribution layer 104. The at least one lower die 110 may be a volatile memory or a non-volatile memory device, but it is not limited thereto.

The at least one lower die 110 may include a lower die pin 110F on the lower surface and be electrically connected to the first redistribution layer 104. The lower die pin 110F is just one example, and an electrical connection may also be made through a solder bump.

The at least one lower die 110 and at least one semiconductor chip may be disposed on the first redistribution layer 104, and it may include a plurality of semiconductor chips. FIG. 1B shows that 9 lower die pins 110F are disposed on the lower surface of the lower die 110, but this is a non-limiting example, and the number of lower die pins 110F may be more or less than 9.

The first through-via 120 may be disposed on the first redistribution layer 104. The first through-via 120 may be disposed on the first redistribution layer 104 and may be electrically coupled with the second redistribution layer 124, which is described below in further detail. In an embodiment, the upper surface of the first through-via 120 may be disposed at the same level as the lower surface of the second redistribution layer 124, and the lower surface of the first through-via 120 may be disposed at the same level as the upper surface of the first redistribution layer 104.

In an embodiment, the first through-via 120 may include a metallic member. For example, the first through-via 120 may include at least one of copper, aluminum, tungsten, nickel, gold, tin, titanium, and alloys thereof.

The first through-via 120 may be spaced apart and disposed outside at least one lower die 110, and the first through-via 120 may provide a thermal path and electrical coupling of the first redistribution layer 104 and the second redistribution layer 124. In this way, by including a plurality of first through-vias 120, efficiency of heat discharge may be maximized.

In an embodiment, and as shown in FIG. 1B, three first through-vias 120 are disposed on each of the left and right sides of the lower die 110, but this is a non-limiting example, and three or fewer or more than three more members may be disposed.

In an embodiment, the shape of the first through-via 120 may be cylindrical, quadrangular prismatic, triangular prismatic, or polygonal prismatic. The shape of the first through-via 120, as a non-limiting example, may provide an electrical coupling or a thermal path.

The first molding material 122 may be a member molding the lower die 110 and the first through-via 120 positioned on the first redistribution layer 104. The first molding material 122 may cover other regions while leaving the rear surface 110B of the lower die 110, which is a semiconductor chip, exposed. As a non-limiting example, the first molding material 122 may be a molding compound, a molding underfill, an epoxy, and/or a resin, and it surrounds and protects the lower die 110 and first through-via 120 and suppresses heat transfer to the outside.

The second redistribution layer 124 may be disposed on the lower die 110, the first through-via 120, and the first molding material 122. Specifically, the second redistribution layer 124 may be disposed on the lower die rear surface 110B, a first through-via upper portion 120T, and a first molding material upper portion 122T. The second redistribution layer 124 may be connected to the upper portion 120T of the first through-via 120 to be electrically coupled with the first redistribution layer 124.

In an embodiment, the lower die rear surface 110B and the second wiring layer 124 may be contact each other. Specifically, the second redistribution layer 124 may be disposed on the rear surface 110B of the lower die 110 to facilitate heat discharge of the lower die 110124 The second redistribution layer 124 may be disposed on the first molding material 122, which is filled in other than the portions where the first through-via 120 and the lower die 110 are disposed.

The at least one upper die 130 may be disposed on the second redistribution layer 124. The at least one upper die 130 may be electrically connected through the first through-via 120, the first redistribution layer 104, and the second redistribution layer 124. Specifically, at least one upper die 130 may include an upper die pin 130F at the lower portion, and may be electrically connected to the second redistribution layer 124 by the upper die pin 130F. The detailed description of at least one upper die 130 may refer to the lower die 110 described with reference to FIG. 1A and FIG. 1B.

The second through-via 140 may be disposed on the second redistribution layer 124. In an embodiment, the upper surface of the second through-via 140 may be positioned at the same level as the lower surface of the heat dissipation member 150, and the lower surface of the second through-via 140 may be positioned at the same level as the upper surface of the second redistribution layer 124.

In an embodiment, the second through-via 140 may be composed of a metallic member. For example, the second through-via 140 may include at least one of copper, aluminum, tungsten, nickel, gold, tin, titanium, and alloys thereof. The second through-via 140 may be spaced apart and disposed outside the at least one upper die 130, and the second through-via 140 may provide a member of a thermal path. In this way, by including a plurality of second through-vias 140, the efficiency of heat discharge generated from at least one upper die 130 may be maximized.

The second molding material 142 may mold the second redistribution layer 124, the upper die 130, and the second through-via 140. The second molding material 142 may be a member molding the lower die 110 and the first through-via 120 positioned on the second redistribution layer 104.

The second molding material 142 may completely cover the rear surface 130B of the upper die 130, which is a semiconductor chip, or may cover other regions while leaving the rear surface 130B of the upper die 130 exposed. When the second molding material 142 completely covers the upper die rear surface 130B, the second molding material upper portion 142T may be disposed at a higher level than the upper die rear surface 130B. When the second molding material 142 covers other regions while the upper die rear surface 130B is exposed, the second molding material upper portion 142T may be disposed at the same level as the upper die rear surface 130B.

In an embodiment, the second molding material 142 may be, as a non-limiting example, a molding compound, a molding underfill, an epoxy, and/or a resin, and the second molding material 142 surrounds and protects the upper die 130 and the first through-via 120 and suppresses the heat transmission to the outside.

The heat dissipation member 150 may be disposed over at least one upper die 130 and the second through-via 140. In an embodiment, the heat dissipation member 150 may contact the second through-via 140. Specifically, the heat dissipation member 150 may be in contact with the second through-via 140 and may not be in contact with the rear surface 130B of the upper die 130. More specifically, the heat dissipation member 150 may be in contact with the second through-via 140 and disposed with the rear surface 130B of the upper die 130 via the second molding material 142 interposed therebetween.

In an embodiment, the heat dissipation member 150 may contact the upper die rear surface 130B. As the heat dissipation member 150 and the upper die rear surface 130B are in contact, a thermal path discharging from the upper die 130 may be shortened.

In an embodiment, the heat dissipation member 150 may be at least one of a metallic member and a resin material. Specifically, the metallic member, as a non-limiting example, may be at least one of copper (Cu), gold (Au), aluminum (Al), tungsten (W), nickel (Ni), tin (Sn), titanium (Ti), and alloys thereof. The resin material may be, as a non-limiting example, at least one of benzocyclobutene (BCB), polyimide, and a resin material thereof.

In an embodiment, the thickness of the heat dissipation member 150 may range between 15 and 25%, including endpoints, of the thickness of the upper die 130. By satisfying the aforementioned range, the heat generated from the upper die 130 may be easily discharged by the heat dissipation member 150. In an embodiment, the thickness of the heat dissipation member 150 may be between 150 and 300 μm, including endpoints.

If the thickness of the heat dissipation member 150 deviates from the upper limit of the aforementioned range, the thickness of the semiconductor package 100 may have an undesirable thickness. When the thickness of the heat dissipation member 150 deviates from the lower limit of the aforementioned range, the heat dissipation effect of the semiconductor package 100 may not be desirably expressed.

In an embodiment and as shown in FIG. 1B, the thickness "D" of the upper die 130 may have a greater thickness than the thickness "d" of the lower die 110. The thickness refers to the height of the lower die 110 and the upper die 130, and the die with the higher thickness is disposed on the second redistribution layer 124.

In an embodiment, the at least one upper die 130 may have a thickness that is between 1.2 and 1.7 times, including endpoints, the thickness of the lower die 110. As the upper die 130 has a larger thickness than the lower die 110, the heat discharged by the second through-via 140 and the heat dissipation member 150 outside the upper die 130 is in contact with a wider area than the first through-via 120 outside the lower die 110, thereby reducing the warpage deformation of the semiconductor package 100 and improving the heat dissipation characteristic of the semiconductor package 100.

In an embodiment, the distance between "t" of the heat dissipation member 150 and the upper die 130 may be less than 10% of the thickness of the upper die. Specifically, the distance between the heat dissipation member 150 and the upper die 130 may be 7% or less with reference to the upper die 130.

In an embodiment, the third molding member 180 may be disposed on the heat dissipation member 150. The third molding member 180 is disposed on the heat dissipation member 150 and is configured to protect the logic semiconductor 102 and the at least one upper die 130 from external impact or moisture. Specifically, the third molding member 180 may protect dies, such as a semiconductor chip disposed under the heat dissipation member 150, and prevent the heat dissipation member 150 from being oxidized. The detailed description of the third molding member 180 may be similar to the first molding member 122 and the second molding member 142 described above.

In an embodiment, a plurality of outer terminals may be disposed under the first redistribution layer 104, and the plurality of outer terminals may include conductive bumps 170, such as solder balls.

Figure 2A:
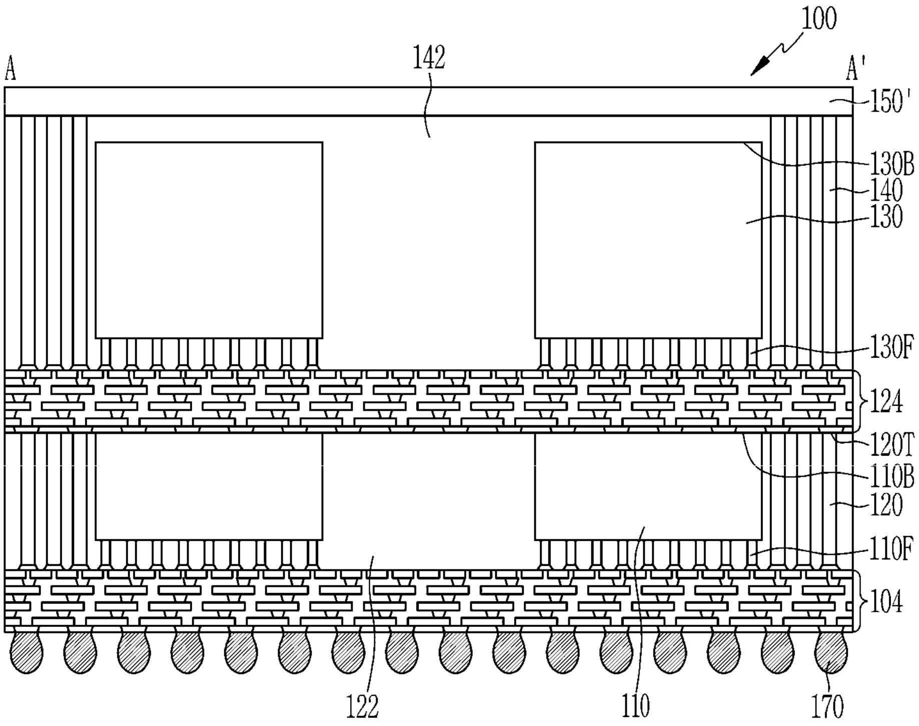
FIG. 2A and FIG. 2B are cross-sectional views of other embodiments of a heat dissipation member according to an embodiment of the present disclosure.
Figure 2B:
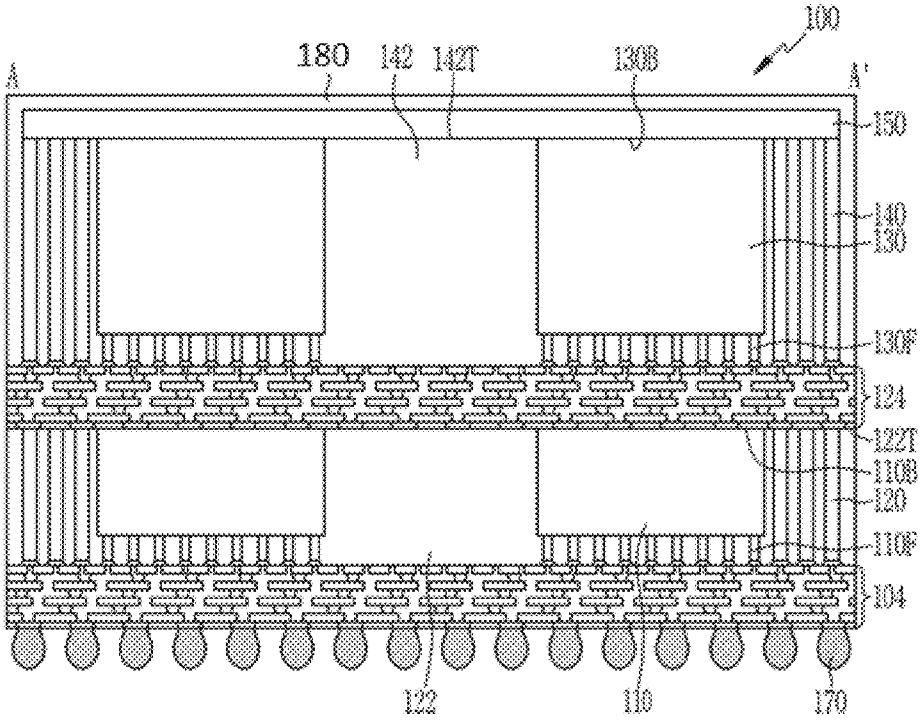

FIG. 2A and FIG. 2B are cross-sectional views of a semiconductor package 100' according to another embodiment of the present disclosure.

Referring to FIG. 2A, the semiconductor package 100' does not include a third molding member 180 on a heat dissipation member 150'. For example, if the heat dissipation member 150' is a resin material, problems such as oxidation do not occur even when it is exposed to the outside, and additional processes such as molding are not required.

Referring to FIG. 2B, in an embodiment, in the semiconductor package 100, the heat dissipation member 150 may contact the upper die rear surface 130B may be. In detail, the distance "t" between the heat dissipation member 150 and the upper die 130 above-described in FIG. 1B is 0 μm, and thus, the heat dissipation member 150 and the upper die rear surface 130B are in contact and disposed on the same level. As the heat dissipation member 150 contacts the upper die rear surface 130B, the area where the upper die 130 is in contact with the heat dissipation member 150 widens. As such, the heat dissipation characteristic in which heat generated from the upper die 130 is discharged through the heat dissipation member 150 is improved.

FIG. 3A to FIG. 3D are cross-sectional views of a semiconductor package 100' according to another embodiment of the present disclosure.

Figure 3A:
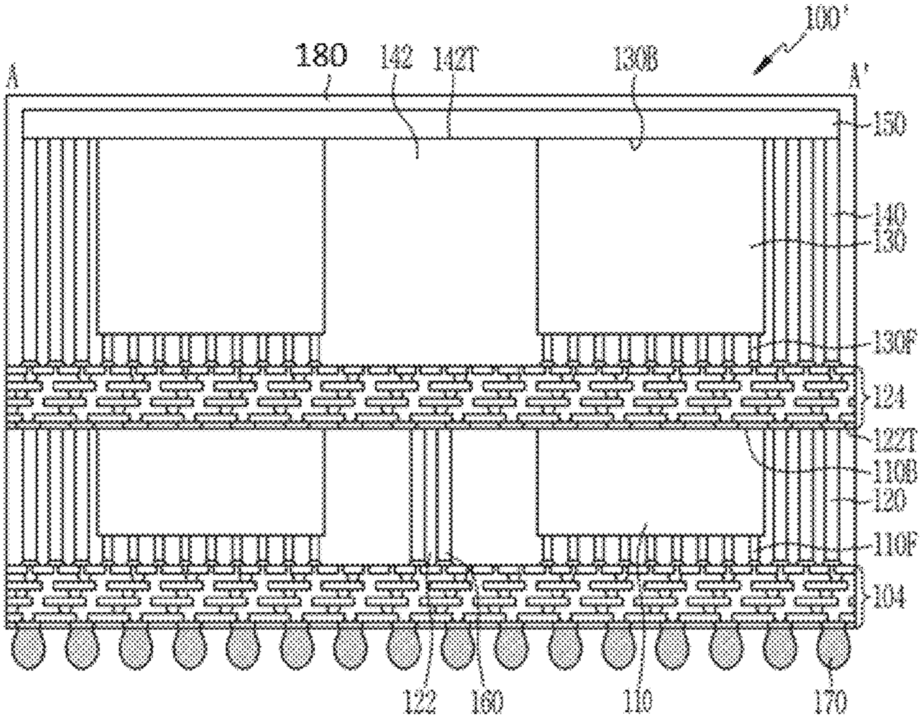
FIG. 3A, FIG. 3B, FIG. 3C, and FIG. 3D are cross-sectional views showing another embodiment of a third through-via.
Figure 3B:
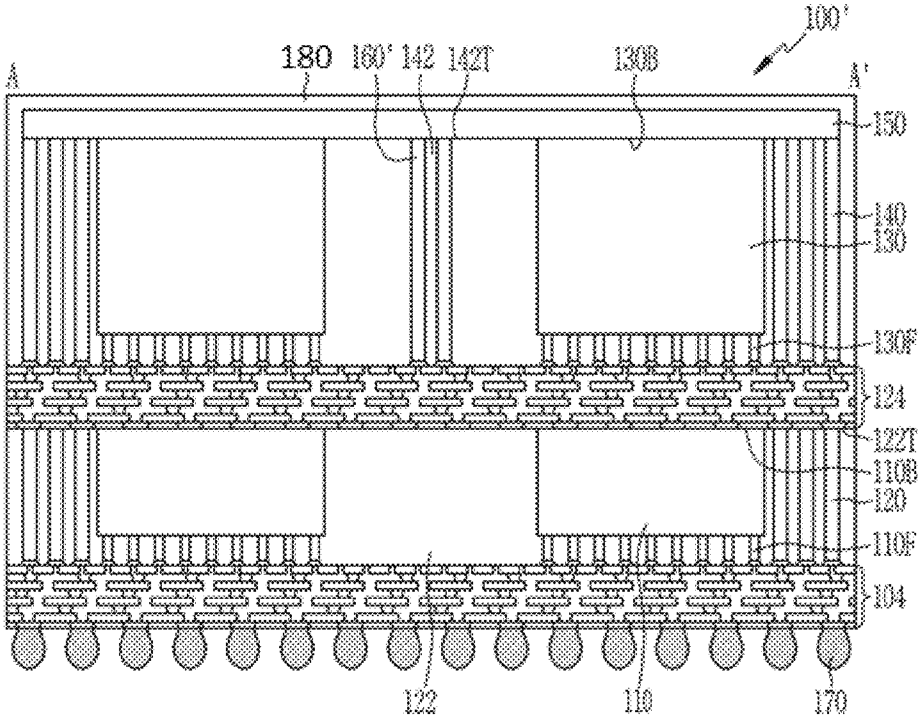

Referring to FIG. 3A and FIG. 3B, a semiconductor package 100' according to another embodiment of the present disclosure may include a first redistribution layer 104, a plurality of lower dies 110 disposed on the first redistribution layer 104, and a first through-via 120 positioned on the first redistribution layer 104 and disposed on the side surface of a plurality of lower dies 110. The semiconductor package 100' may also include a first molding material 122 molding the first redistribution layer 104, the plurality of lower dies 110, and the first through-via 120, and a second redistribution layer 124 disposed on a plurality of lower dies 110, the through-via 120, and the first molding material 122 and in contact with the lower die rear surface 110B, the through-via upper portion 120T, and the first molding material upper portion 122T. Additionally, the semiconductor package 100' may include a plurality of upper dies 130 positioned on the second redistribution layer 124, a second through-via 140 positioned on the second redistribution layer 124, and a second molding material 142 molding the second redistribution layer, the upper die 130, and the second through-via 140. Additionally, the semiconductor package 100' may include a heat dissipation member 150 disposed on the upper die 130 and the second through-via 140 and in contact with the upper die 130 and the second through-via 140, and third through-vias 160 and 160' disposed between a plurality of lower dies 110 or between a plurality of upper dies 130.

The detailed descriptions of the first redistribution layer 104, the second redistribution layer 124, the first through-via 120, the second through-via 140, the first molding material 122, and the second molding material 142 may refer to the description above with reference to FIG. 1B. The detailed description for the lower die 110 and the upper die 130 may refer to the description above with reference to FIG. 1B, except that a plurality of the lower dies 110 and the upper dies 130 are provided.

In an embodiment, the first through-via 120 may be disposed on the side surface of a plurality of lower dies 110. Specifically, when a plurality of lower dies 110 are disposed, the first through-via 120 may be disposed on the left and right sides of the plurality of lower dies 110, which are the exterior sides of the plurality of lower dies 110, rather than between the plurality of lower dies 110. Accordingly, a plurality of lower dies 110 may be disposed between the first through-vias 120.

In an embodiment, the first through-via 120 may be disposed by being in contact with or spaced apart from the plurality of lower dies 110. In this regard, the second through-via 140 and the plurality of upper dies 130 may be identical to the first through-via 120 and the plurality of lower dies 110, respectively, as described above.

In an embodiment, the third through-vias 160 and 160' may be disposed between the plurality of lower dies 110 or the plurality of upper dies 130. The third through-vias 160 and 160' may be disposed between the lower dies 110 or the upper dies 130 in which a plurality of at least two dies are disposed. As the third through-vias 160 and 160' are disposed between a plurality of lower dies 110 or a plurality of upper dies 130, the heat generated from a plurality of lower dies 110 or a plurality of upper dies 130 may be efficiently discharged.

When the third through-via 160 is disposed between a plurality of lower dies 110, it may contact with the same level as the upper level of the first redistribution layer 104 and the lower level of the second redistribution layer 124. When the third through-via 160' is disposed between a plurality of upper dies 130, it may contact with the same level as the upper level of the second redistribution layer 124 and the lower level of the heat dissipation member 150. The material or characteristics of the third through-via 160 may be similar to the first through-via 120 or the second through-via 140 described above with reference to FIG. 1B.

Figure 3C:
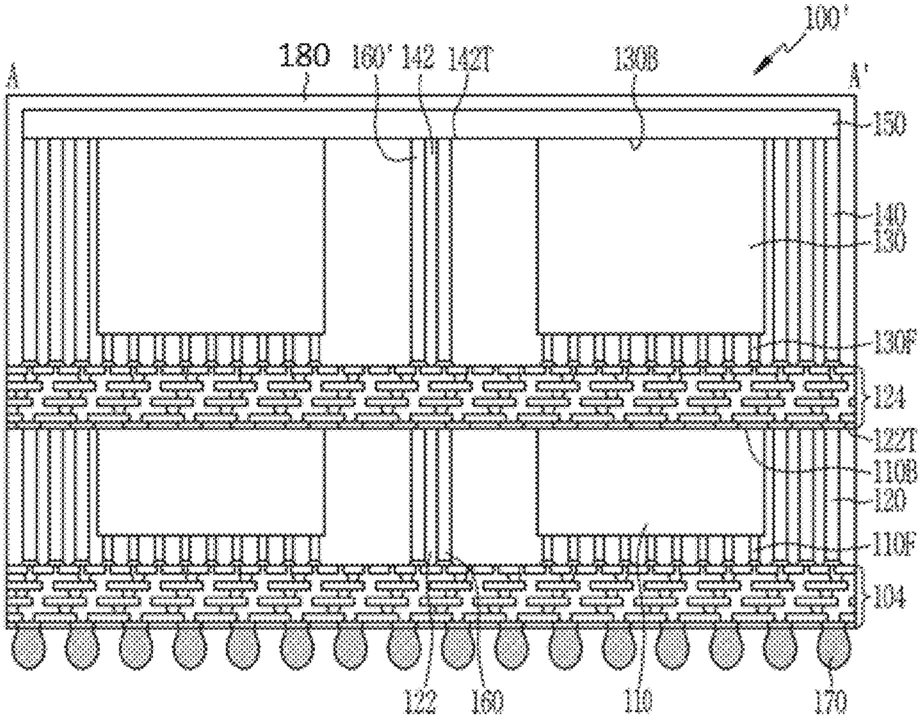

Referring to FIG. 3C, according to an embodiment of the present disclosure, the third through-vias 160 and 160' may be disposed between a plurality of lower dies 110 and between a plurality of upper dies 130. Specifically, the third through-vias 160 and 160' may be disposed between a plurality of lower dies 110 and simultaneously disposed between a plurality of upper dies 130. As such, as the third through-vias 160 and 160' are simultaneously disposed between a plurality of lower dies 110 and a plurality of upper dies 130, the strength of the contact surface may be reinforced, the warpage problem of the semiconductor package 100' may be prevented, and durability may be increased.

Figure 3D:
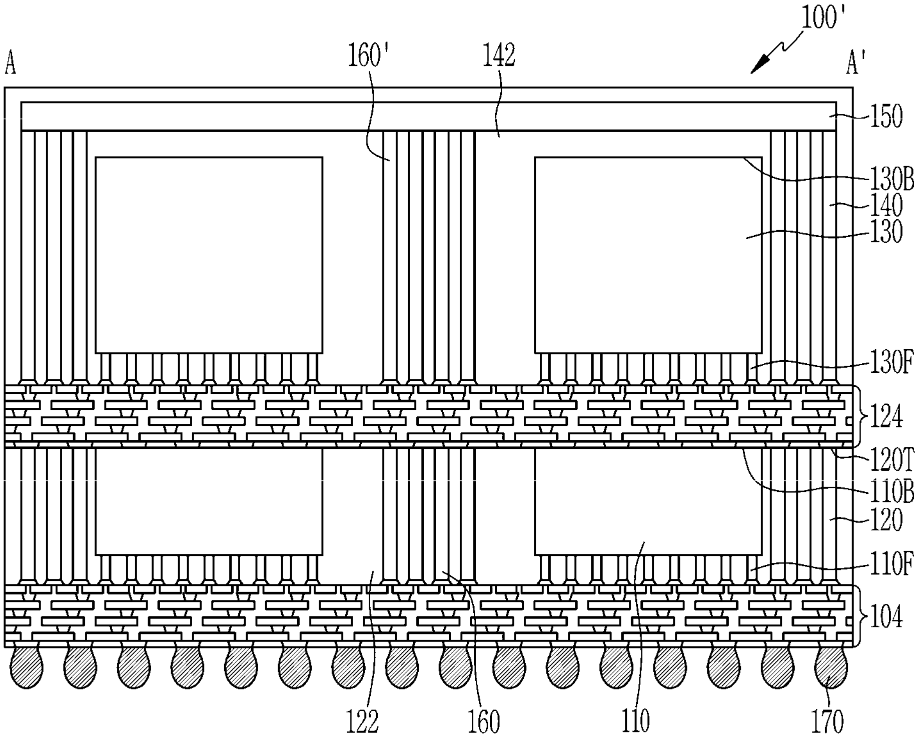

Referring to FIG. 3D, in an embodiment, two or more third through-vias 160 and 160' may be disposed, and as shown in FIG. 3D, it may include four members. This is a non-limiting example, as there is no limit to the number of the third through-vias 160 and 160'. When there are multiple third through-vias 160 and 160', the distance from the lower die 110 or the upper die 130 may be disposed to be the same as the distance between the first through-via 120 or the second through-via 140 and the lower die 110 or the upper die 130. It should be understood that in other variations, the distance from the lower die 110 or the upper die 130 may be disposed differently.

In an embodiment, the third through-vias 160 and 160' may be disposed in different numbers. For example, the number of the third through-vias 160 disposed between a plurality of lower dies 110 may be greater than the number of the third through-vias 160' disposed between a plurality of upper dies 130, and vice versa.

FIG. 4A to FIG. 4G are schematic views for each process step for a manufacturing method of a semiconductor package 100 and 100' according to an embodiment of the present disclosure.

Figure 4A:
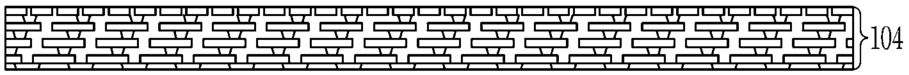
FIG. 4A, FIG. 4B, FIG. 4C, FIG. 4D, FIG. 4E, FIG. 4F, and FIG. 4G are schematic views for each process of a manufacturing method of a semiconductor package according to an embodiment of the present disclosure.

FIG. 4A is a step of forming a first redistribution layer 104. Specifically, this is a step of forming the first redistribution layer 104 by forming a redistribution structure on a carrier (not shown). The carrier may include a silicon-based material, such as glass or a silicon oxide, an organic material, aluminum oxide, any combination of these materials, and the like. The first redistribution layer 104 is formed on the carrier. In an embodiment, the first redistribution layer 104 may include a dielectric material layer, a redistribution line, and a via disposed within the dielectric material layer. In another embodiment, the redistribution line and the via are not limited to that shown in FIG. 4A, and there may be more or less redistribution lines and vias than shown in FIG. 4A.

In the step of forming the first redistribution layer 104, the via is formed at the bottom, and the via may be formed by a photoresist etching process or a hard mask etching process. The via may be formed of copper, aluminum, nickel, a composition including at least one of these, or an alloy including at least one of these. In an embodiment, the via may be deposited using physical vapor deposition (PVD).

After forming the via, a dielectric material layer is formed to correspond to the height of the via. The dielectric material layer may be formed of, as a non-limiting example, a polymer, such as PBO or polyimide, or an inorganic dielectric material, such as a silicon nitride or a silicon oxide. In an embodiment, the dielectric material layer may be formed by various deposition methods, and non-limiting examples include chemical vapor deposition (CVD), atomic layer deposition (ALD), and plasma enhanced chemical vapor deposition (CVD). Thereafter, the upper surface of the via and the dielectric material layer may be planarized using a chemical mechanical polishing (CMP) process or a mechanical grinding process.

Subsequently, the first redistribution layer 104 may be formed by sequentially forming the redistribution line, the via, and the dielectric material layer according to the above-described method.

Figure 4B:
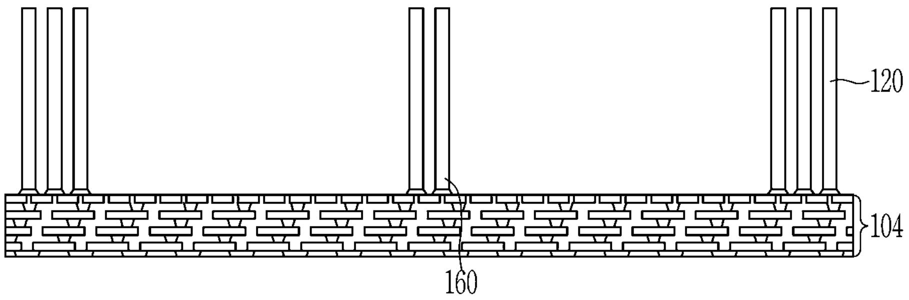

FIG. 4B shows a step of forming the at least one first through-via 120 over the first redistribution layer 104. The first through-via 120 may be disposed on the exterior side of the at least one lower die 110, except for the space where the at least one lower die 110 are stacked.

In an embodiment, forming the at least one first through-via 120 over the first redistribution layer 104 may include forming the third through-via 160. In an embodiment where the semiconductor package 100, 100' includes a plurality of the at least one lower dies 110, the third through-via 160 may be formed to be disposed between a plurality of lower dies 110. The first through-via 120 and the third through-via 160, as a non-limiting example, may be formed through plating deposition.

Figure 4C:
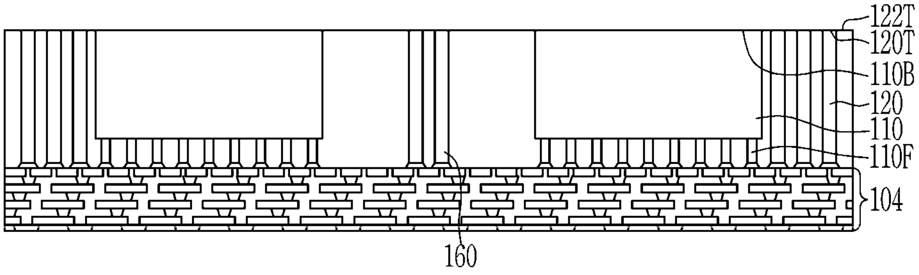

FIG. 4C shows a step of forming the at least one lower die 110 on the first redistribution layer 104 and molding the first redistribution layer 104, the first through-via 120, and the lower die 110 with the first molding material 122. The least one lower die 110 may be disposed, as described above, between the first through-vias 120.

In an embodiment where the semiconductor package 100, 100' includes a plurality of the at least one lower dies 110, the lower dies 110 may be disposed such that the third through-via 160 are disposed between the plurality of lower dies 110. Thereafter, a molding process may be performed using the first molding material 122 to cover the first redistribution layer 104, the first through-via 120, and the lower die 110. The molding process may proceed so that the lower die 110 is completely filled or the rear surface 110B of the lower die 110 is exposed.

In an embodiment, the molding of the first redistribution layer 104, the first through-via 120, and the lower die 110 includes grinding to expose the rear surface 110B of the lower die 110. When the lower die 110 is completely filled during the molding process, the grinding may be included so that the lower surface of the second redistribution layer 124 is in contact with the lower die rear surface 110B to improve the heat dissipation characteristic. The grinding may be performed by a general process, such as a chemical mechanical polishing process or a mechanical grinding process.

Figure 4D:
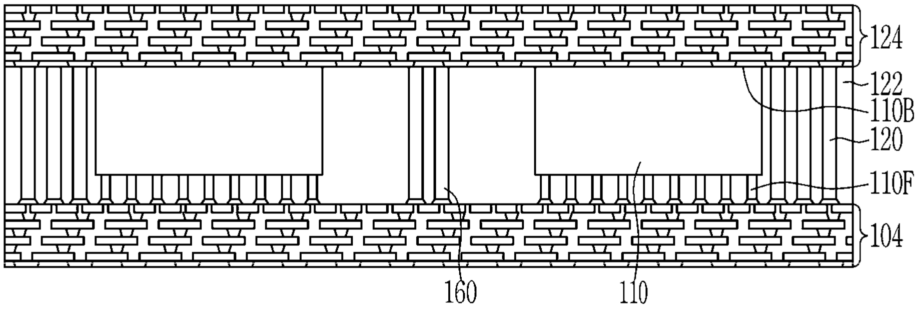

FIG. 4D shows a step of forming a second redistribution layer 124 on the first through-via upper portion 120T, the lower die rear surface 110B, and the first molding material upper portion 122T. The forming of the second redistribution layer 124 may be similar to forming the first redistribution layer 124 described above with reference to FIG. 4A.

Figure 4E:
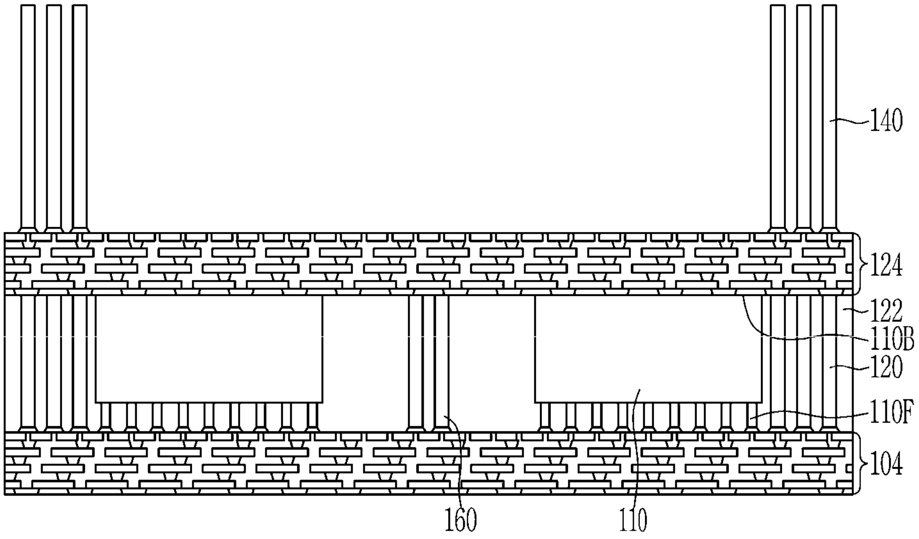

FIG. 4E shows a step of forming a second through-via 140 on the second redistribution layer 124. The forming of the second through-via 140 on the second redistribution layer 124 may be similar to forming the first through-via 120 as described above with reference to FIG. 4B.

In an embodiment, the height of the second through-via 140 may be greater than the height of the first through-via 120.

In an embodiment, forming at least one second through-via 140 on the second redistribution layer 124 may include forming the third through-via 160'. The third through-via 160' may be formed to be disposed between the plurality of lower dies 110 when a plurality of lower dies 110 are provided within the semiconductor packages 100, 100'.

Figure 4F:
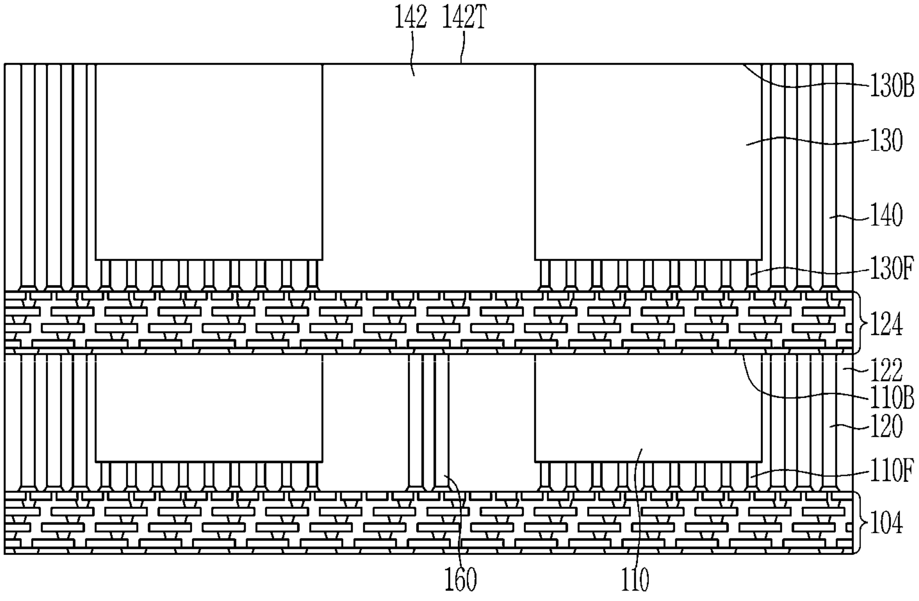

FIG. 4F shows a step of forming the upper die 130 on the second redistribution layer 124 and molding the second redistribution layer 124, the second through-via 140, and the upper die 130 with a second molding material 142. In an embodiment, forming the upper die 130 on the second redistribution layer 124 may include forming the at least one upper die 130 to have a thickness between 1.2 and 1.7 times, including endpoints, the thickness of the lower die 110 on the second redistribution layer 124, as described above with reference to FIG. 1B.

The molding process may be performed using the second molding material 142 to cover the second redistribution layer 124, the second through-via 140, and the upper die 130. The molding process may be performed so that the upper die 130 is completely filled or the rear surface 110B of the upper die is exposed, as described above with reference to FIG. 4C.

Figure 4G:
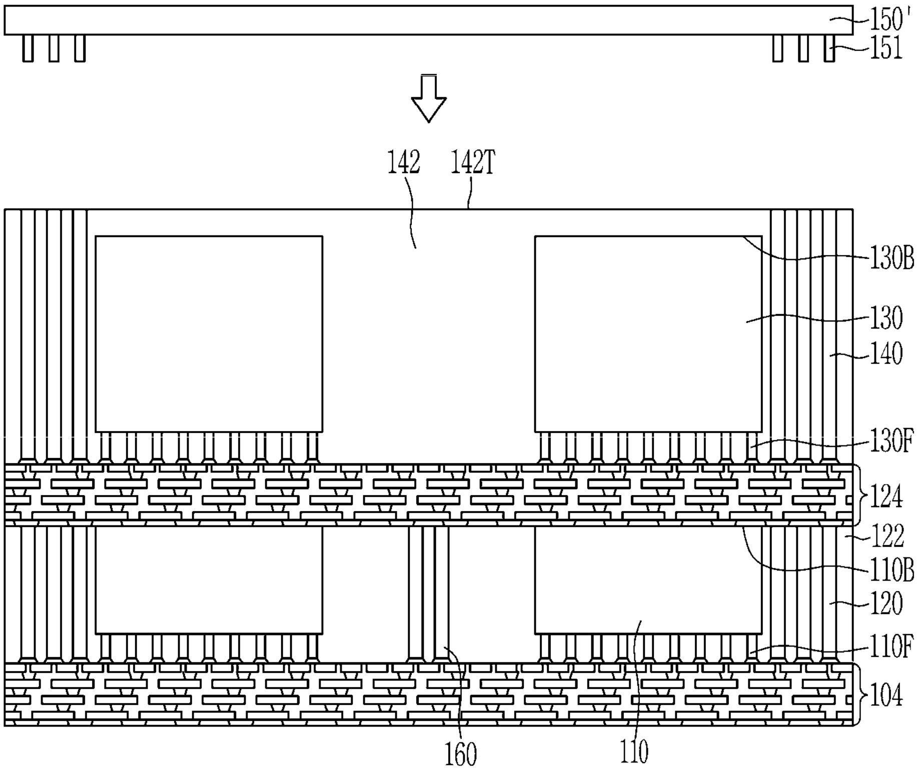

FIG. 4G shows a step of forming the heat dissipation member 150 on the upper die 130, the second through-via 140, and the second molding material 142 according to an embodiment. In an embodiment, forming the heat dissipation member 150 on the upper die 130, the second through-via 140, and the second molding material 142 includes assembling and forming the heat dissipation member 150 to have an assemble member 151, where the width of the assemble member 151 is less than the width of the second through-via 140.

As such, the assemble member 151 may be engaged with the second through-via 140 therein by being inserted into the second through-via 140. The assemble member 151 may be made of the same or different material than the second through-via 140.

In another embodiment, forming the heat dissipation member 150 on the upper die 130, the second through-via 140, and the second molding material 142 may include forming the heat dissipation member 150 by the plating deposition. When the heat dissipation member 150 is a metallic member, such as the second through-via 140, it may be formed through a deposition process, such as a plating deposition process.

In an embodiment, before forming the heat dissipation member 150 on the upper die 130, the second through-via 140, and the second molding material 142, the upper die rear surface 130B may be filled or exposed by including the grinding, as described above with reference to FIG. 1B.

In an embodiment, after forming the heat dissipation member 150 on the upper die 130, the second through-via 140, and the second molding material 142, the molding process may proceed with forming the third molding material 180 in a manner similar to forming the first molding material 122 or the second molding material 142. The third molding material 180 may protect the dies.

Thereafter, a solder ball, which is the conductive bump 170, may be formed under the first redistribution layer 104 to complete a semiconductor package 100 configured to electrically connect to an external circuit.

The present disclosure is not limited to the exemplary embodiments and/or examples, but may be manufactured in various forms, and it will be apparent to those skilled in the art to which the present disclosure pertains that various modifications and alterations may be made without departing from the spirit or essential feature of the present disclosure. Therefore, it is to be understood that the embodiments and/or examples described hereinabove are illustrative rather than being restrictive in all aspects.

What is claimed is:

1. A semiconductor package comprising:
- a first redistribution layer;
- at least one lower die on the first redistribution layer;
- a first through-via on the first redistribution layer;
- a first molding material that molds the first redistribution layer, the at least one lower die, and the first through-via;
- a second redistribution layer on the at least one lower die, the first through-via, and the first molding material;
- at least one upper die on the second redistribution layer and having a thickness between 1.2 and 1.7 times, including endpoints, greater than a thickness of the at least one lower die;
- a second through-via on the second redistribution layer;
- a second molding material that molds the second redistribution layer, the at least one upper die, and the second through-via; and
- a heat dissipation member on the at least one upper die and the second through-via, wherein the heat dissipation member contacts the second through-via,
- wherein the first through-via is electrically isolated from each die of the semiconductor package and shaped to provide a thermal path from the at least one lower die to the second redistribution layer.

2. The semiconductor package of claim 1, wherein the heat dissipation member is one of a metallic member and a resin material, wherein the metallic member includes at least one of copper (Cu), gold (Au), aluminum (Al), tungsten (W), nickel (Ni), tin (Sn), titanium (Ti), and alloys thereof, and wherein the resin material includes at least one of benzocyclobutene (BCB), and polyimide.

3. The semiconductor package of claim 1, wherein a thickness of the heat dissipation member is between 15 and 25%, including endpoints, of the thickness of the at least one upper die.

4. The semiconductor package of claim 1, wherein a distance between the heat dissipation member and the at least one upper die is less than 10% of the thickness of the at least one upper die.

5. The semiconductor package of claim 4, wherein the heat dissipation member contacts a surface of the at least one upper die.

6. The semiconductor package of claim 1, wherein a surface of the at least one lower die contacts a wiring layer.

7. The semiconductor package of claim 1, wherein the at least one lower die includes a plurality of lower dies, and wherein the semiconductor package further includes a third through-via between the plurality of lower dies.

8. The semiconductor package of claim 1, wherein the at least one upper die includes a plurality of upper dies, and wherein the semiconductor package further includes a third through-via between the plurality of upper dies.

9. A semiconductor package comprising:
- a first redistribution layer;
- a plurality of lower dies on the first redistribution layer;
- a first through-via on the first redistribution layer and a side of the plurality of lower dies;
- a first molding material that molds the first redistribution layer, the plurality of lower dies, and the first through-via;
- a second redistribution layer on the plurality of lower dies, the first through-via, and the first molding material, wherein the second redistribution layer contacts a surface of the plurality of lower dies, an upper portion of the first through-via, and an upper portion of the first molding material;

a plurality of upper dies on the second redistribution layer;

a second through-via on the second redistribution layer and a side of the plurality of upper dies;

a second molding material that molds the second redistribution layer, the plurality of upper dies, and the second through-via;

a heat dissipation member on the plurality of upper dies and the second through-via, wherein the heat dissipation member contacts the plurality of upper dies and the second through-via; and a third through-via between the plurality of lower dies or between the plurality of upper dies, wherein the first through-via is electrically isolated from each die of the semiconductor package and shaped to provide a thermal path from at least one of the plurality of lower dies to the second redistribution layer.

10. The semiconductor package of claim 9 further comprising a plurality of through-vias, wherein the plurality of through-vias are between the plurality of lower dies and between the plurality of upper dies.

11. The semiconductor package of claim 9, wherein a thickness of the plurality of upper dies is between 1.2 and 1.7 times, including endpoints, greater than a thickness of the plurality of lower dies.

12. The semiconductor package of claim 9, wherein the plurality of lower dies are between the first through-via, and the plurality of upper dies are between the second through-via.

13. The semiconductor package of claim 9, wherein a thickness of the heat dissipation member is between 15 and 25%, including endpoints, of a thickness of the plurality of upper dies.

14. The semiconductor package of claim 13, wherein the thickness of the heat dissipation member is between 150 and 300 μm, including endpoints.

* * * * *